(12) United States Patent
Manku et al.

(10) Patent No.: US 7,046,980 B1
(45) Date of Patent: May 16, 2006

(54) METHOD AND APPARATUS FOR UP-AND DOWN-CONVERSION OF RADIO FREQUENCY (RF) SIGNALS

(75) Inventors: Tajinder Manku, Waterloo (CA);
Chris Snyder, Lunenburg (CA);
Gareth Weale, New Hamburg (CA);
Lawrence Wong, Markham (CA)

(73) Assignee: SiRiFIC Wireless Corporation, Waterloo (CA)

( * ) Notice: Subject to any disclaimer, the term of this patent is extended or adjusted under 35 U.S.C. 154(b) by 312 days.

(21) Appl. No.: 10/070,280

(22) PCT Filed: Sep. 1, 2000

(86) PCT No.: PCT/CA00/00996

§ 371 (c)(1),
(2), (4) Date: Jul. 29, 2002

(87) PCT Pub. No.: WO01/17122

PCT Pub. Date: Mar. 8, 2001

(30) Foreign Application Priority Data

Sep. 1, 1999 (CA) .................................. 2281236

(51) Int. Cl.
*H04B 1/26* (2006.01)

(52) U.S. Cl. .................. 455/323; 455/315; 455/114.2; 455/296; 455/255

(58) Field of Classification Search ................ 455/118, 455/114.2, 115.1, 126, 76, 183.1, 189.1, 190.1, 455/207, 208, 209, 296, 313, 314, 315, 323, 455/255
See application file for complete search history.

(56) References Cited

U.S. PATENT DOCUMENTS

| 4,110,834 | A | 8/1978 | Altwein |
| 4,193,034 | A | 3/1980 | Vance |
| 4,238,850 | A | 12/1980 | Vance |
| 4,254,503 | A | 3/1981 | Vance |
| 4,271,501 | A | 6/1981 | Vance et al. |
| 4,322,851 | A | 3/1982 | Vance |
| 4,462,107 | A | 7/1984 | Vance |
| 4,470,147 | A | 9/1984 | Goatcher |
| 4,476,585 | A | 10/1984 | Reed |
| 4,480,327 | A | 10/1984 | Vance |

(Continued)

FOREIGN PATENT DOCUMENTS

CA 1226627 9/1987

(Continued)

OTHER PUBLICATIONS

Aue et al. "Multicarrier spread spectrum modulation with reduce dynamic range," IEEE Vehicular Technology Conference Atlanta, vol. 2, pp. 914-917 (1996).

(Continued)

*Primary Examiner*—Edward F. Urban
*Assistant Examiner*—Blane J. Jackson
(74) *Attorney, Agent, or Firm*—Townsend and Townsend and Crew LLP

(57) ABSTRACT

This patent describes a method and system which overcomes the LO-leakage problem of direct conversion and similar RF transmitters and receivers. To solve this problem a virtual LO™ signal is generated which emulates mixing with a local oscillator (LO) signal. However, the virtual local oscillator (VLO) signal is constructed using signals that do not contain a significant amount of power (or no power at all) at the wanted output RF frequency, so there is no LO component to leak to the output. The invention also does not require sophisticated filters or large capacitors as other designs in the art, so it is fully integratable.

29 Claims, 12 Drawing Sheets

U.S. PATENT DOCUMENTS

| | | | |
|---|---|---|---|
| 4,488,064 A | 12/1984 | Vance | |
| 4,506,262 A | 3/1985 | Vance et al. | |
| 4,521,892 A | 6/1985 | Vance et al. | |
| 4,523,324 A | 6/1985 | Marshall | |
| 4,525,835 A | 6/1985 | Vance et al. | |
| 4,571,738 A | 2/1986 | Vance | |
| 4,583,239 A | 4/1986 | Vance | |
| 4,599,743 A | 7/1986 | Reed | |
| 4,618,967 A | 10/1986 | Vance et al. | |
| 4,677,690 A | 6/1987 | Reed | |
| 4,726,042 A | 2/1988 | Vance | |
| 4,736,390 A * | 4/1988 | Ward et al. | 375/316 |
| 4,811,425 A | 3/1989 | Feerst | |
| 4,955,039 A | 9/1990 | Rother et al. | |
| 5,128,623 A | 7/1992 | Gilmore | |
| 5,179,728 A | 1/1993 | Sowadski | |
| 5,220,688 A | 6/1993 | Tao | |
| 5,228,042 A | 7/1993 | Gauthier et al. | |
| 5,303,417 A | 4/1994 | Laws | |
| 5,361,408 A | 11/1994 | Watanabe et al. | |
| 5,390,346 A | 2/1995 | Marz | |
| 5,416,803 A | 5/1995 | Janer | |
| 5,422,889 A * | 6/1995 | Sevenhans et al. | 370/442 |
| 5,448,772 A * | 9/1995 | Grandfield | 455/333 |
| 5,451,899 A | 9/1995 | Lawton | |
| 5,467,294 A | 11/1995 | Hu et al. | |
| 5,471,665 A * | 11/1995 | Pace et al. | 455/343.2 |
| 5,530,929 A | 6/1996 | Lindqvist et al. | |
| 5,715,530 A | 2/1998 | Eul | |
| 5,838,717 A | 11/1998 | Ishii et al. | |
| 5,896,421 A * | 4/1999 | Zamat et al. | 375/296 |
| 5,918,167 A | 6/1999 | Tiller et al. | |
| 5,918,169 A | 6/1999 | Dent | |
| 5,949,830 A | 9/1999 | Nakanishi | |
| 5,953,643 A | 9/1999 | Speake et al. | |
| 6,002,923 A | 12/1999 | Sahlman | |
| 6,014,408 A | 1/2000 | Naruse et al. | |
| 6,016,422 A * | 1/2000 | Bartusiak | 455/76 |
| 6,029,058 A | 2/2000 | Namgoog et al. | |
| 6,049,706 A | 4/2000 | Cook et al. | |
| 6,061,551 A | 5/2000 | Sorrells et al. | |
| 6,073,000 A | 6/2000 | Shinohara | |
| 6,091,940 A | 7/2000 | Sorrels et al. | |
| 6,125,272 A | 9/2000 | Bautista | |
| 6,148,184 A | 11/2000 | Manku et al. | |
| 6,167,247 A | 12/2000 | Kannel et al. | |
| 6,194,947 B1 | 2/2001 | Lee et al. | |
| 6,225,848 B1 * | 5/2001 | Tilley et al. | 327/307 |
| 6,243,569 B1 | 6/2001 | Atkinson | |
| 6,308,058 B1 | 10/2001 | Souetinov et al. | |
| 6,324,388 B1 | 11/2001 | Souetinov | |
| 2001/0014596 A1 | 8/2001 | Takaki et al. | |

FOREIGN PATENT DOCUMENTS

| | | |
|---|---|---|
| CA | 1290403 | 10/1991 |
| CA | 2243757 A1 | 2/1999 |
| CA | 2245958 | 2/1999 |
| CA | 2305134 A1 | 4/1999 |
| CA | 2224953 | 6/1999 |
| CA | 2316969 A1 | 7/1999 |
| CA | 2270337 | 10/1999 |
| CA | 2272877 | 11/1999 |
| CA | 2281236 A1 | 3/2001 |
| CA | 2339744 A1 | 3/2001 |
| CA | 2331228 A1 | 7/2001 |
| CA | 2300045 A1 | 9/2001 |
| CA | 2273671 | 3/2002 |
| EP | 0634855 A1 | 1/1995 |
| EP | 0721270 A1 | 7/1996 |
| EP | 0782249 A1 | 7/1997 |
| EP | 837565 A | 4/1998 |
| EP | 0899868 A1 | 3/1999 |
| EP | 902549 A | 3/1999 |
| EP | 1085665 A2 | 3/1999 |
| EP | 977351 A | 2/2000 |
| EP | 0993125 A2 | 4/2000 |
| EP | 1067689 A2 | 1/2001 |
| EP | 1085652 A2 | 3/2001 |
| GB | 2329085 A | 3/1999 |
| GB | 2331207 A | 5/1999 |
| WO | WO 96/01006 A | 1/1996 |
| WO | WO 96/01006 A1 | 1/1996 |
| WO | WO 97/50202 A2 | 12/1997 |
| WO | WO 99/55000 A2 | 10/1999 |
| WO | WO 99/55015 A1 | 10/1999 |
| WO | WO 00/05815 A1 | 2/2000 |
| WO | WO 00/69085 A1 | 11/2000 |

OTHER PUBLICATIONS

Abidi "Direct-Conversion Radio Transceivers for Digital Communications," IEEE J. of Solid-State Circuits, 30:1399-1410 (1995).

Anvari et al. "Performance of a Direct Conversion Receiver with π/4-DPSK Modulated Signal," IEEE publication CH2944-7/91/0000/0822, pp. 822-827 (1991).

Cho et al., "A Single Chip CMOS Direct-Conversion Transceiver For 900MHz Spread-Spectrum Digital Cordless Phones," IEEE 1999 International Solid-State Circuits Conference paper TP13.5 (1999).

Enz "Design of Low-Power and Low-Voltage Analog and RF Integrated Circuits in Ultra Deep Submicron CMOS Technologies," available from the Electronics Laboratory of EPFL (Lausanne) website http://legwww.epfl.ch (2001).

GCT Semiconductor, Inc. "GCT's Direct Conversion Technology," product information available from http://www.gct21.com (2002).

Heinen et al. "A 2.7V 2.5GHz Bipolar Chipset for Digital Wireless Communication," IEEE 1997 International Solid-State Circuits Conference, paper SA 18.4 (1997).

Marshall et al. A 2.7GHz GSM Transceiver ICs with On-Chip Filtering, IEEE 1995 International Solid-State Circuits Conference, paper TA 8.7 (1995).

McDonald "A 2.5GHz BiCMOS Image-Reject Front-End," 1993 International Solid-State Circuits Conference, paper TP 9.4 (1993).

Razavi "Design Considerations for Direct-Conversion Receivers," IEEE Transactions on Circuits and Systems—II: Analog and Digital Signal Prcessing 44:428-435 (1997).

Rudell et al. "A 1.9GHz Wide-Band IF Double Conversion CMOS Integrated Receiver for Cordless Telephone Applications," IEEE 1997 International Solid-State Circuits Conference, paper SA 18.3 (1997).

Sanduleanu et al. "Chopping: a technique for noise and offset reduction," *Power, Accuracy and Noise Aspects in CMOS Mixed-Signal Design*, chapter 5, sections 5.2 and 5.4, EDA Books Online http://www.decafe.com (1999).

Sanduleanu et al. "Low-Power Low-Voltage Chopped Transconductance Amplifier for Noise and Offset Reduction," conference paper, 23rd European Solid-State Circuits Conference Southampton, UK, Sep. 16-18, 1997.

Sevenhans et al. "An integrated Si bipolar RF transceiver for zero if 900 MHz GSM digital mobile radio frontend of a hand portable phone." Proceedings of the Custom ICConference, San Diego 1991; IEEE publication 0-7803-0768-2, pp561-564 (1992).

Stetzler et al. "A 2.7V to 4.5 V Single-Chip GSM Transceiver RF Integrated Circuit," 1995 International Solid-State Circuits Conference, paper TA 8.8 (1995).

\* cited by examiner

METHOD AND APPARATUS FOR UP-AND DOWN-CONVERSION OF RADIO FREQUENCY (RF) SIGNALS

The present invention relates generally to communications, and more specifically, to a fully-integrable method and apparatus for up- and down-conversion of radio frequency (RF) and baseband signals with improved performance.

BACKGROUND OF THE INVENTION

Many communication systems modulate electromagnetic signals from baseband to higher frequencies for transmission, and subsequently demodulate those high frequencies back to their original frequency band when they reach the receiver. The original (or baseband) signal, may be, for example: data, voice or video. These baseband signals may be produced by transducers such as microphones or video cameras, be computer generated, or transferred from an electronic storage device. In general, the high transmission frequencies provide longer range and higher capacity channels than baseband signals, and because high frequency RF signals can propagate through the air, they can be used for wireless channels as well as hard wired or fibre channels.

All of these signals are generally referred to as radio frequency (RF) signals, which are electromagnetic signals, that is, waveforms with electrical and magnetic properties within the electromagnetic spectrum normally associated with radio wave propagation. The electromagnetic spectrum was traditionally divided into 26 alphabetically designated bands, however, the International Telecommunication Union (ITU) formally recognizes 12 bands, from 30 Hz to 3000 GHz. New bands, from 3 THz to 3000 THz, are under active consideration for recognition.

Wired communication systems which employ such modulation and demodulation techniques include computer communication systems such as local area networks (LANs), point to point signalling, and wide area networks (WANs) such as the Internet. These networks generally communication data signals over electrical or optical fibre channels. Wireless communication systems which may employ modulation and demodulation include those for public broadcasting such as AM and FM radio, and UHF and VHF television. Private communication systems may include cellular telephone networks, personal paging devices, HF radio systems used by taxi services, microwave backbone networks, interconnected appliances under the Bluetooth standard, and satellite communications. Other wired and wireless systems which use RF modulation and demodulation would be known to those skilled in the art.

One of the current problems in the art, is to develop physically small and inexpensive modulation and demodulation techniques and devices that have good performance characteristics. For cellular telephones, for example, it is desirable to have transmitters and receivers (which may be referred to in combination as a transceiver) which can be fully integrated onto integrated circuits (ICs).

Several attempts at completely integrated transceiver designs have met with limited success. For example, most RF topology typically requires at least two high quality filters that cannot be economically integrated within any modern IC technology. Other RF receiver topologies exist, such as image rejection architectures, which can be completely integrated on a chip, but lack in overall performance. Most receivers use the "super-heterodyne" topology, which provides excellent performance, but does not meet the desired level of integration for modern wireless systems.

Existing transceiver solutions and their associated problems and limitations are summarized below.

1. Super-Heterodyne

The super-heterodyne receiver uses a two-step frequency translation method to convert an RF signal to a baseband signal. FIG. 1 presents a block diagram of a typical super-heterodyne receiver 10. Generally, the mixers labelled M1 12, MI 14, and MQ 16 are used to translate an incoming RF signal to baseband or to some intermediate frequency (IF). The balance of the components amplify the signal being processed and filter noise from it.

More specifically, the RF band pass filter (BPF1) 18 first filters the incoming signal and corruptive noise coming from the antenna 20, attenuating out of band signals and passing the desired signal (note that this band pass filter 18 may also be a duplexer). A low noise amplifier 22 then amplifies the filtered antenna signal, increasing the strength of the RF signal and reducing the noise figure of the receiver 10. The signal is next filtered by another band pass filter (BPF2) 24 usually identified as an image rejection filter. The desired signal, plus residual unwanted signals, then enter mixer M1 12 which multiplies this signal with a periodic sinusoidal signal generated by the local oscillator (LO1) 26. The mixer M1 12 receives the signal from the image rejection filter 24 and causes both a down-conversion and an up-conversion in the frequency domain. Usually, the down-converted portion is retained at the so-called "Intermediate Frequency" (IF).

Generally, a mixer is a circuit or device that accepts as its input two different frequencies and presents at its output:

(a) a signal equal in frequency to the sum of the frequencies of the input signals;

(b) a signal equal in frequency to the difference between the frequencies of the input signals; and (c) the original input frequencies.

Note that the frequency conversion process causes a second band of frequencies to be superimposed upon the desired signal at the IF frequency. These "image frequencies" are also passed by the band pass filter 24 and corrupt the desired signal. Note also that the typical embodiment of a mixer is a digital switch, which may generate significantly more tones than those described in (a) through (c).

The IF signal is next filtered by a band pass filter (BPF3) 28 typically called the channel filter, which is centered around the IF frequency, thus filtering out mixer signals (a) and (c) above.

The signal is then amplified by an amplifier (IFA) 30, and is split into its in-phase (I) and quadrature (O) components, using mixers MI 14 and MQ 16, and orthogonal mixing signals generated by local oscillator (LO2) 32 and 90 degree phase shifter 34. LO2 32 generates a regular, periodic signal which is typically tuned to the IF frequency, so that the signals coming from the outputs of MI 14 and MQ 16 are now at baseband, that is, the frequency at which they were originally generated. The two signals are next filtered using low pass filters LPFI 36 and LPFQ 38 to remove the unwanted products of the mixing process, producing baseband I and Q signals. The signals may then be amplified by gain-controlled amplifiers AGCI 40 and AGCQ 42, and digitized via analog to digital converters ADI 44 and ADO 46 if required by the receiver.

The main problems with the super-heterodyne design are:

it requires expensive off-chip components, particularly band pass filters 18, 24, 28, and low pass filters 36, 38 to remove unwanted signal components;

the off-chip components require design trade-offs that increase power consumption and reduce system gain;

image rejection is limited by the off-chip components, not by the target integration technology;

isolation from digital noise can be a problem; and it is not fully integratable.

2. Image Rejection Architectures

Several image rejection architectures exist, but are not widely used. The two most well known being the Hartley Image Rejection Architecture and the Weaver Image Rejection Architecture. There are other designs, which are generally based on these two architectures, and other methods which employ poly-phase filters to cancel image components. Generally, either accurate signal phase shifts or accurate generation of quadrature local oscillators are employed in these architectures to cancel the image frequencies. The amount of image cancellation is directly dependent upon the degree of accuracy in producing the phase shift or in producing the quadrature local oscillator signals.

Although the integratability of these architectures is high, their performance is relatively poor due to the required accuracy of the phase shifts and quadrature oscillators. This architecture has been used for dual mode receivers on a single chip.

3. Direct Conversion

Direct conversion architectures demodulate RF signals to baseband in a single step, by mixing the RF signal with a local oscillator signal at the carrier frequency of the RF signal. There is therefore no image frequency, and no image components to corrupt the signal. Direct conversion receivers offer a high level of integratability, but also have several important problems. Hence, direct conversion receivers have thus far proved useful only for signalling formats that do not place appreciable signal energy near DC after conversion to baseband.

A typical direct conversion receiver is shown in FIG. 2. The RF band pass filter (BPF1) 18 first filters the signal coming from the antenna 20 (this band pass filter 18 may also be a duplexer). A low noise amplifier 22 is then used to amplify the filtered antenna signal, increasing the strength of the RF signal and reducing the noise figure of the receiver 10.

The signal is then split into its quadrature components and demodulated in a single stage using mixers MI 14 and MQ 16, and orthogonal signals generated by local oscillator (LO2) 32 and 90 degree phase shifter 34. L02 32 generates a regular, periodic signal which is tuned to the incoming wanted frequency rather than an IF frequency as in the case of the super-heterodyne receiver. The signals coming from the outputs of MI 14 and MQ 16 are now at baseband, that is, the frequency at which they were originally generated. The two signals are next filtered using low pass filters LPFI 36 and LPFQ 38, are amplified by gain-controlled amplifiers AGCI 40 and AGCQ 42, and are digitized via analog to digital converters ADI 44 and ADQ 46.

Direct conversion RF receivers have several advantages over super-heterodyne systems in term of cost, power, and level of integration, however, there are also several serious problems with direct conversion. These problems include:

noise near baseband (that is, 1/f noise) which corrupts the desired signal;

local oscillator (LO) leakage in the RF path that creates DC offsets. As the LO frequency is the same as the incoming signal being demodulated, any leakage of the LO signal onto the antenna side of the mixer will pass through to the output side as well;

local oscillator leakage into the RF path that causes desensitization. Desensitation is the reduction of desired signal gain as a result of receiver reaction to an undesired signal. The gain reduction is generally due to overload of some portion of the receiver, such as the AGC circuitry, resulting in suppression of the desired signal because the receiver will no longer respond linearly to incremental changes in input voltage.

noise inherent to mixed-signal integrated circuits corrupts the desired signal;

large on-chip capacitors are required to remove unwanted noise and signal energy near DC, which makes integrability expensive. These capacitors are typically placed between the mixers and the low pass filters; and errors are generated in the quadrature signals due to inaccuracies in the 90 degree phase shifter.

4. Near Zero-IF Conversion

This receiver architecture is similar to the direct conversion architecture, in that the RF input signal band is translated brought close to baseband in a single step using a regular, periodic oscillator signal. However, the desired signal is not brought exactly to baseband and therefore DC offsets and 1/f noise do not contaminate the output signal. Image frequencies are again a problem though, as in the case of the super-heterodyne structure.

Additional problems encountered with near zero-IF architectures include:

the need for very accurate quadrature local oscillators;

the need for several balanced signal paths for purposes of image cancellation;

noise inherent to mixed-signal integrated circuits which corrupts the desired output signal; and isolation from digital noise can be a problem.

5. Sub-Sampling Down-Conversion

This method of signal down-conversion utilizes subsampling of the input signal to effect the frequency translation, that is, the input signal is sampled at a lower rate than the signal frequency. This may be done, for example, by use of a sample and hold circuit.

Although the level of integration possible with this technique is the highest among those discussed thus far, the subsampling down-conversion method suffers from two major drawbacks:

subsampling of the RF signal causes aliasing of unwanted noise power to DC. Sampling by a factor of m increases the down-converted noise power of the sampling circuit by a factor of 2m; and subsampling also increases the effect of noise in the sampling clock. In fact, the clock phase noise power is increased by $m^2$ for sampling by a factor of m.

There is therefore a need for a method and apparatus of modulating and demodulating RF signals which allows the desired integrability along with good performance.

SUMMARY OF THE INVENTION

It is therefore an object of the invention to provide a novel method and system of modulation and demodulation which obviates or mitigates at least one of the disadvantages of the prior art.

One aspect of the invention is broadly defined as a first signal generator for producing a first time-varying signal $\phi_1$; and a second signal generator for producing a second time-varying signal $\phi_2$; where $\phi_1 * \phi_2$ has significant power at the frequency of a local oscillator signal being emulated, and neither $\phi_1$ nor $\phi_2$ has significant power at the frequency of the local oscillator signal being emulated.

BRIEF DESCRIPTION OF THE DRAWINGS

These and other features of the invention will become more apparent from the following description in which reference is made to the appended drawings in which:

FIG. 4 (b) presents a second exemplary mixer input signals pairing plotted in amplitude against time, in an embodiment of the invention;

DETAILED DESCRIPTION OF THE INVENTION

The present invention relates to the frequency translation of RF signals to and from baseband in highly integrated receivers and transmitters. It is particularly concerned with the generation of signals used in the translation process which have properties that solve the image-rejection problems associated with heterodyne receivers and transmitters and the LO-leakage and 1/f noise problems associated with direct conversion receivers and transmitters.

Figure 1:
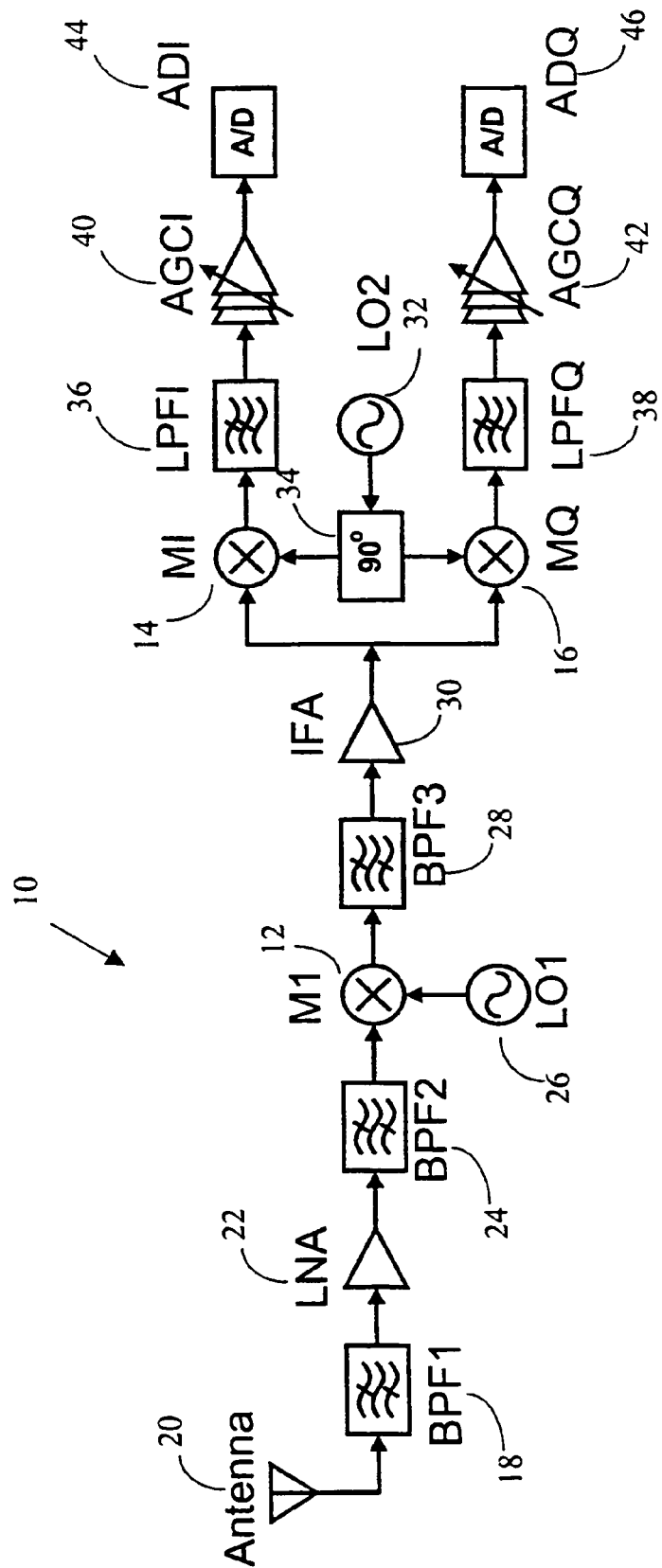
FIG. 1 presents a block diagram of a super-heterodyne system as known in the art.
Figure 2:
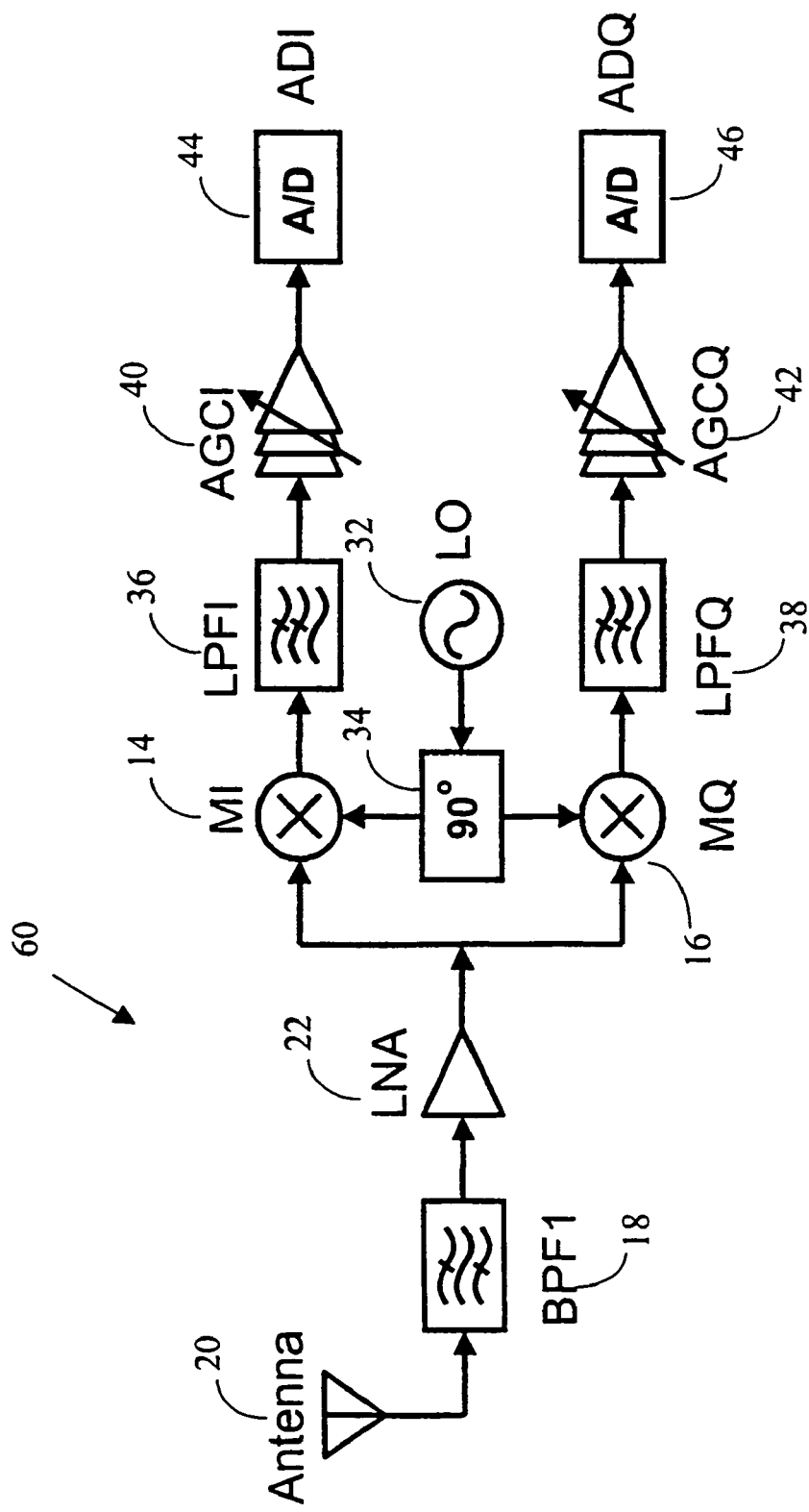
FIG. 2 presents a block diagram of a direct conversion transmitter as known in the art.
Figure 3:
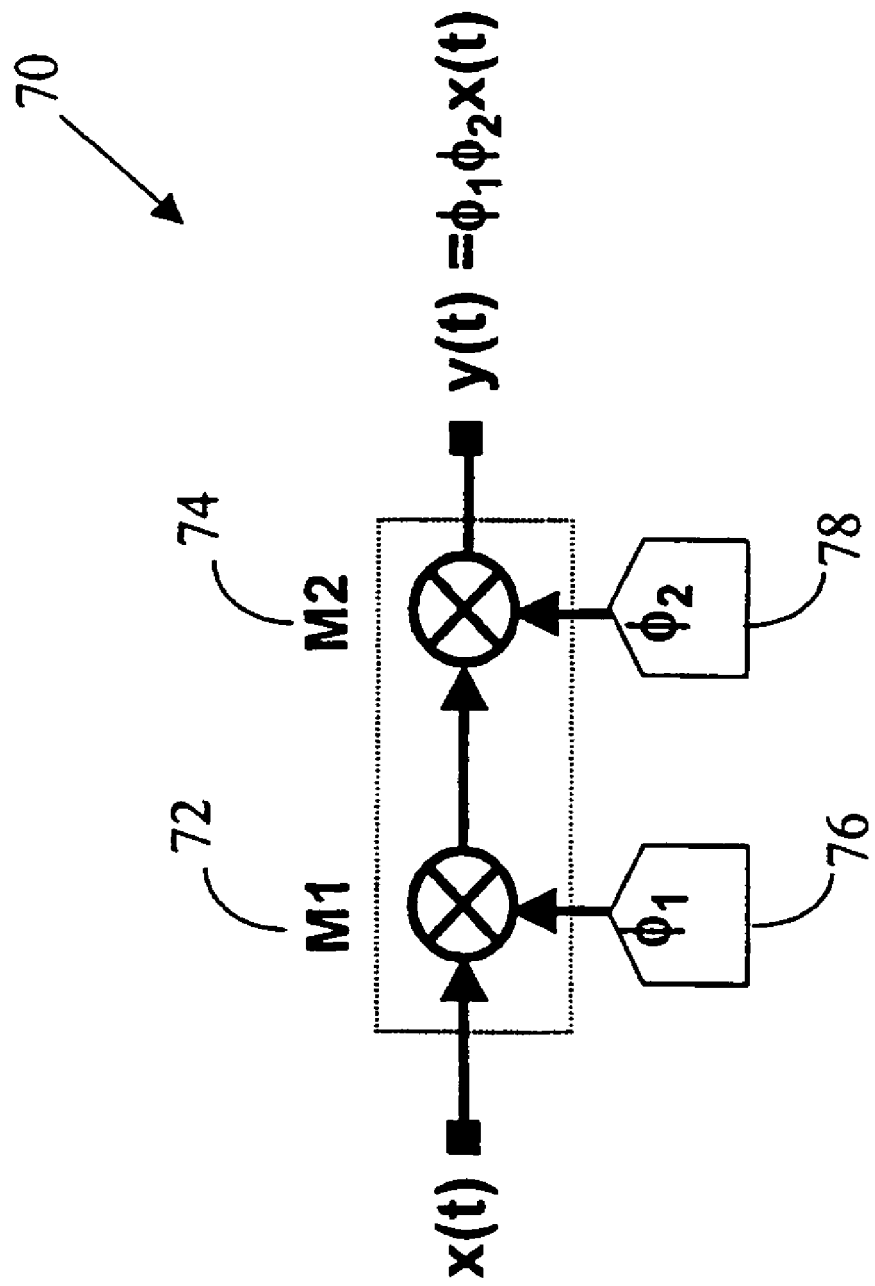
FIG. 3 presents a mixer and synthesizer arrangement in a broad embodiment of the invention.

A circuit which addresses the objects outlined above, is presented as a block diagram in FIG. 3. This figure presents a modulator or demodulator topography 70 in which an input signal x(t) is mixed with two synthesized signals (labelled $\phi_1$ and $\phi_2$) which are irregular and vary in the time domain (TD), to effect the desired modulation or demodulation. The two mixers M1 72 and M2 74 are standard mixers known in the art, having the typical properties of an associated noise figure, linearity response, and conversion gain. The selection and design of these mixers would follow the standards known in the art, and could be, for example, double balanced mixers. Though this figure implies various elements are implemented in analogue form they can be implemented in digital form.

The two synthesizers 76 and 78 generate two time-varying functions $\phi_1$ and $\phi_2$ that together comprise a virtual local oscillator (VLO) signal. These two functions have the properties that their product emulates a local oscillator (LO) signal that has significant power at the carrier frequency, but neither of the two signals has a significant level of power at the frequency of the LO being emulated. As a result, the desired modulation or demodulation is affected, but there is no LO signal to leak into the RF path.

The representation in FIG. 3 is exemplary, as any two-stage or multiple stage mixing architecture may be used to implement the invention. As well, the synthesizer for generating the time-varying mixer signals $\phi_1$ and $\phi_2$ may be comprised of a single device, or multiple devices.

In current receiver and transmitter technology, frequency translation of an RF signal to and from baseband is performed by multiplying the input signal by regular, periodic, sinusoids. If one multiplication is performed, the architecture is said to be a direct-conversion or homodyne architecture, while if more than one multiplication is performed the architecture is said to be a heterodyne or super-heterodyne architecture. Direct-conversion transceivers suffer from LO leakage and 1/f noise problems which limit their capabilities, while heterodyne transceivers require image-rejection techniques which are difficult to implement on-chip with high levels of performance.

The problems of image-rejection, LO leakage and 1/f noise in highly integrated transceivers can be overcome by using more complex signals than simple, regular, periodic, sinusoids in the frequency translation process. These signals have tolerable amounts of power at the RF band frequencies both in the signals themselves and in any other signals produced during their generation. Two example of such signals ($\phi_1$ and $\phi_2$) are presented in FIGS. 4(a) and 4(b), and are described in detail hereinafter.

The preferred criteria for selecting the functions $\phi_1$ and $\phi_2$ are:

(i) for the signal x(t) to be translated to baseband, $\phi_1(t)*\phi_2(t)$ must have a frequency component at the carrier frequency of x(t);

(ii) in order to minimize image problems, $\phi_1(t)*\phi_2(t)$ must have less than a tolerable amount energy at frequencies other than the carrier frequency of x(t) or at least far enough away that these image frequencies can be significantly filtered on-chip prior to down-conversion; and (iii) in order to minimize LO leakage problems, the signals $\phi_1$ and $\phi_2$ must not have significant amounts of power in the RF output signal bandwidth. That is, the amount of power generated at the output frequency should not effect the overall system performance of the transmitter or receiver in a significant manner;

(iv) also to avoid LO leakage found in conventional direct conversion and directly modulated topologies, the signals required to generate $\phi_1$ and $\phi_2$ or the intermediate signals which occur, should not have a significant amount of power at the output frequency;

(v) $\phi_2*\phi_2$ should not have a significant amount of power within the bandwidth of the up-converted RF (output) signal. This ensures that if $\phi_1$ leaks into the input port, it does not produce a signal within the RF signal at the output. It also ensures that if $\phi_2$ leaks into node between the two mixers, it does not produce a signal within the RF signal at the output; and (vi) if x(t) is an RF signal, $\phi_1*\phi_1*\phi_2$ should not have a significant amount of power within the bandwidth of the RF signal at baseband. This ensures that if $\phi_1$ leaks into the input port, it does not produce a signal within the baseband signal at the output.

These signals can, in general, be random, pseudo-random, periodic functions of time, analogue or digital waveforms.

It would be clear to one skilled in the art that virtual LO signals may be generated which provide the benefits of the invention to greater or lesser degrees. While it is possible in certain circumstances to have almost no LO leakage, it may be acceptable in other circumstances to incorporate virtual LO signals which still allow a degree of LO leakage.

Figure 4:
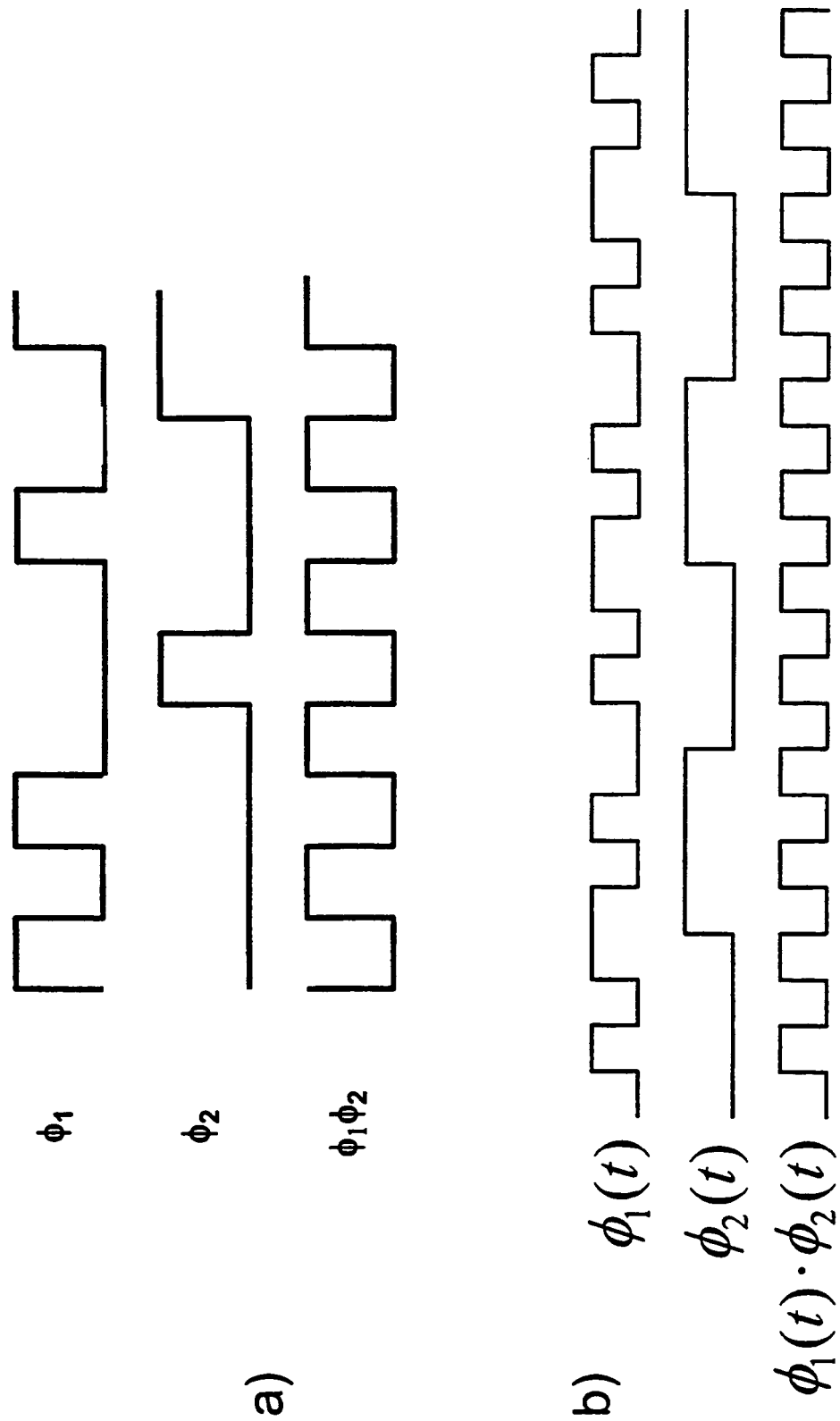
FIG. 4 (a) presents a first exemplary mixer input signals pairing plotted in amplitude against time, in an embodiment of the invention.

Exemplary sets of acceptable waveforms are presented in FIGS. 4(a) and 4(b), plotted in amplitude versus time. In FIG. 4(a), five cycles of the VLO signal are presented, labelled $\phi_1\phi_2$. It is important to note that at no point in the operation of the circuit is an actual "$\phi_1\phi_2$" signal ever generated; the mixers receive separate $\phi_1$ and $\phi_2$ signals, and mix them with the input signal using different physical components. Hence, there is no LO signal which may leak into the circuit. The states of these $\phi_1$ and $\phi_2$ signals with respect to the hypothetical $\phi_1\phi_2$ output are as follows:

| $\phi_1\phi_2$ | $\phi_1$ | $\phi_2$ |
| --- | --- | --- |
| Cycle 1 - LO | HI | LO |
| Cycle 1 - HI | LO | LO |
| Cycle 2 - LO | HI | LO |
| Cycle 2 - HI | LO | LO |
| Cycle 3 - LO | LO | HI |
| Cycle 3 - HI | LO | LO |
| Cycle 4 - LO | HI | LO |
| Cycle 4 - HI | LO | LO |
| Cycle 5 - LO | LO | HI |
| Cycle 5 - HI | HI | HI |

Similarly, FIG. 4(b) presents a second exemplary set of acceptable waveforms, plotted in amplitude versus time. In this case, however, the waveforms repeat on a four cycle pattern. The states of these $\phi_1$ and $\phi_2$ signals with respect to the hypothetical $\phi_1\phi_2$ output are as follows:

| $\phi_1\phi_2$ | $\phi_1$ | $\phi_2$ |
| --- | --- | --- |
| Cycle 1 - LO | LO | LO |
| Cycle 1 - HI | HI | LO |
| Cycle 2 - LO | LO | LO |
| Cycle 2 - HI | HI | LO |
| Cycle 3 - LO | HI | HI |
| Cycle 3 - HI | LO | HI |
| Cycle 4 - LO | HI | HI |
| Cycle 4 - HI | LO | HI |

While these signals may be described as "aperiodic", groups of cycles may be repeated successively. For example, the pattern of the $\phi_1$ and $\phi_2$ input signals presented in FIG. 4(a) which generate the $\phi_1*\phi_2$ signal, repeat with every five cycles. Similarly, the pattern of the $\phi_1$ and $\phi_2$ input signals presented in FIG. 4(b) repeat with every four cycles. Longer cycles could certainly be used.

It would be clear to one skilled in the art that many additional pairings of signals may also be generated. The more thoroughly the above criteria (i)–(vi) for selection of the $\phi_1$ and $\phi_2$ signals are complied with, the more effective the invention will be in overcoming the problems in the art.

Figure 12:
FIG. 12 presents a block diagram of an embodiment of the invention employing N mixers and N time-domain signals.

As well, rather than employing two mixing signals shown above, sets of three or more may be used (additional description of this is given hereinafter with respect to FIG. 12).

The topology of the invention is similar to that of two stage or multistage modulators and demodulators, but the use of irregular, time-varying mixer signal provides fundamental advantages over known transmitters and receivers. For example:
  minimal 1/f noise;
  minimal imaging problems;
  minimal leakage of a local oscillator (LO) signal into the RF output band;
  removes the necessity of having a second LO and various (often external) filters; and
  has a higher level of integration as the components it does require are easily placed on an integrated circuit. For example, no large capacitors or sophisticated filters are required.

The invention provides the basis for fully integrated communications transmitters and receivers. Increasing levels of integration have been the driving impetus towards lower cost, higher volume, higher reliability and lower power consumer electronics since the inception of the integrated circuit. This invention will enable communications devices to follow the same integration route that other consumer electronic products have benefited from.

Specifically, advantages from the perspective of the manufacturer when incorporating the invention into a product include:

1. significant cost savings due to the decreased parts count of an integral device. Decreasing the parts count reduces the cost of inventory control, reduces the costs associated with warehousing components, and reduces the amount of manpower to deal with higher part counts;
2. significant cost savings due to the decreased manufacturing complexity. Reducing the complexity reduces time to market, cost of equipment to manufacture the product, cost of testing and correcting defects, and reduces time delays due to errors and problems on the assembly line;
3. reduces design costs due to the simplified architecture. The simplified architecture will shorten the first-pass design time and total design cycle time as a simplified design will reduce the number of design iterations required;
4. significant space savings and increased manufacturability due to the high integrability and resulting reduction in product form factor (physical size). This implies huge savings throughout the manufacturing process as smaller device footprints enable manufacturing of products with less material such as printed circuit substrate, smaller product casing, and smaller final product packaging;
5. simplification and integrability of the invention will yield products with higher reliability, greater yield, less complexity, higher life span and greater robustness; and
6. due to the aforementioned cost savings, the invention will enable the creation of products that would otherwise be economically unfeasible.

Hence, the invention provides the manufacturer with a significant competitive advantage.

From the perspective of the consumer, the marketable advantages of the invention include:
  lower cost products, due to the lower cost of manufacturing;
  higher reliability as higher integration levels and lower parts counts imply products will be less prone to damage from shock, vibration and mechanical stress;
  higher integration levels and lower parts counts imply longer product life span;

lower power requirements and therefore lower operating costs;

higher integration levels and lower parts counts imply lighter weight and physically smaller products; and the creation of economical new products.

The invention can be applied in many ways which would be clear to one skilled in the art. A number of manners of creating VLO signals and applying them are described hereinafter, but it is understood that these embodiments are exemplary and not limiting.

Since the mixers in most transceivers act as solid state switches being turning on and off, it is preferable to drive the mixers using square waveforms rather than sinusoids. Square waveforms with steep leading and trailing edges will switch the state of the mixers more quickly, and at a more precise moment in time than sinusoid waveforms.

Figure 5:
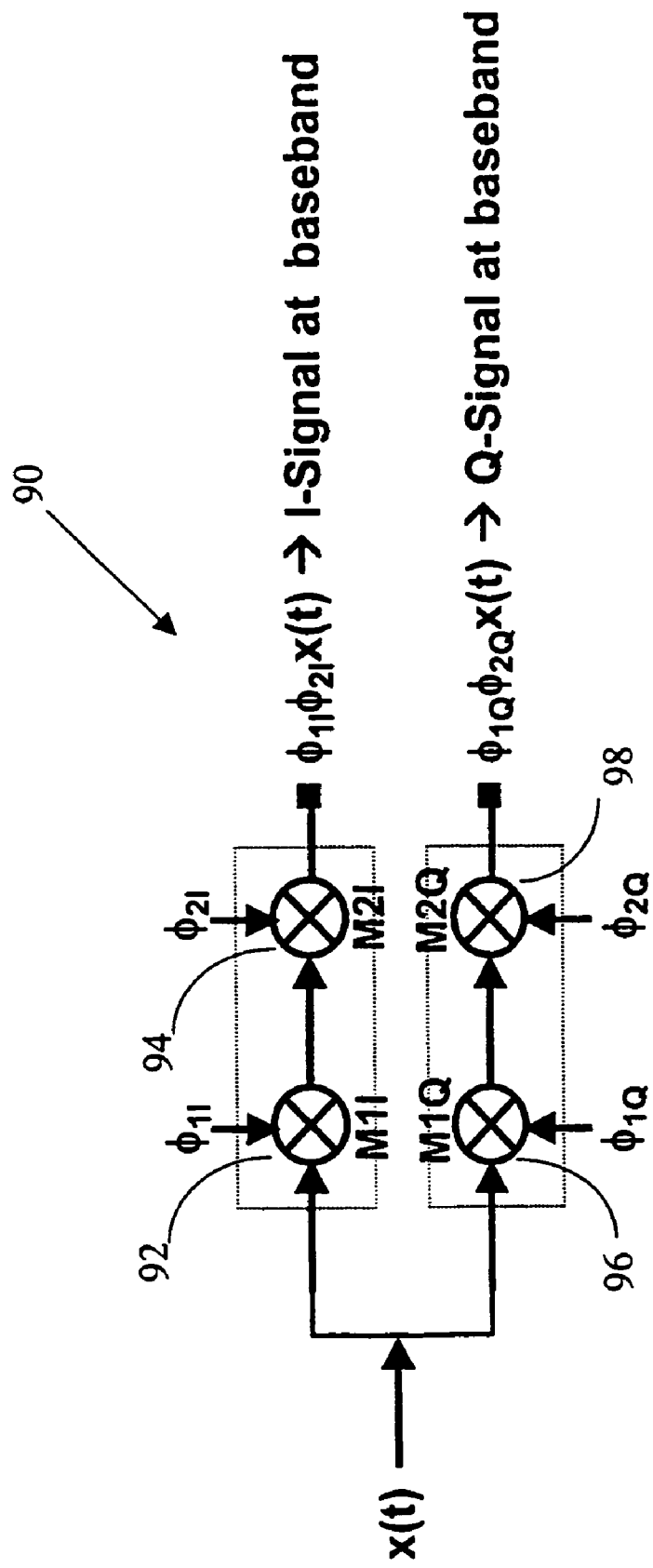
FIG. 5 presents a mixer and synthesizer arrangement for modulation or demodulation of in-phase and quadrature components of an input signal in an embodiment of the invention.

It is also important to note that in many modulation schemes, it is necessary to modulate or demodulate both in-phase (I) and quadrature (Q) components of the input signal, which requires a modulator or demodulator 90 as presented in the block diagram of FIG. 5. In this case, four modulation functions would have to be generated: $\phi_{1I}$, which is 90 degrees out of phase with $\phi_{1Q}$ and $\phi_{2I}$, which is 90 degrees out of phase with $\phi_{2Q}$. The pairing of signals $\phi_{1I}$, and $\phi_{2I}$ must meet the function selection criteria listed above, as must the signal pairing of $\phi_{1Q}$, and $\phi_{2Q}$. The mixers 92, 94, 96, 98 are standard mixers as known in the art.

As shown in FIG. 5, mixer M1I 92 receives the input signal x(t) and mixes it with $\phi_{1I}$; subsequent to this, mixer M2I 94 mixes signal x(t) $\phi_{1I}$ with $\phi_{2I}$ to yield the in-phase component of the input signal, that is, x(t) $\phi_{1I}\phi_{2I}$. A complementary process occurs on the quadrature side of the demodulator, where mixer M1Q 96 receives the input signal x(t) and mixes it with $\phi_{1Q}$; after which mixer M2Q 98 mixes signal x(t) $\phi_{1Q}$ with $\phi_{2Q}$ to yield the quadrature phase component of the input signal, that is, x(t) $\phi_{1Q} \phi_{2Q}$. Several of the synthesizer 76, 78 designs presented herein produce in-phase components only, but it would be clear to one skilled in the art how to generate complementary quadrature mixing signal pairs. Generally, separate in-phase and quadrature channels have not been identified in the interests of simplicity.

Several methods of generating such VLO signals are presented in FIGS. 6 through 10. Since the LO-leakage problem can occur when power is generated at frequencies in the RF band anywhere on chip, it is preferable that condition (iv) stated above be followed for intermediate signals produced during the generation of the signals $\phi_1$ and $\phi_2$. However, since the leakage path to these intermediate signals often provide some isolation, in such a case the condition on the intermediate signals can be somewhat relaxed.

Figure 6:
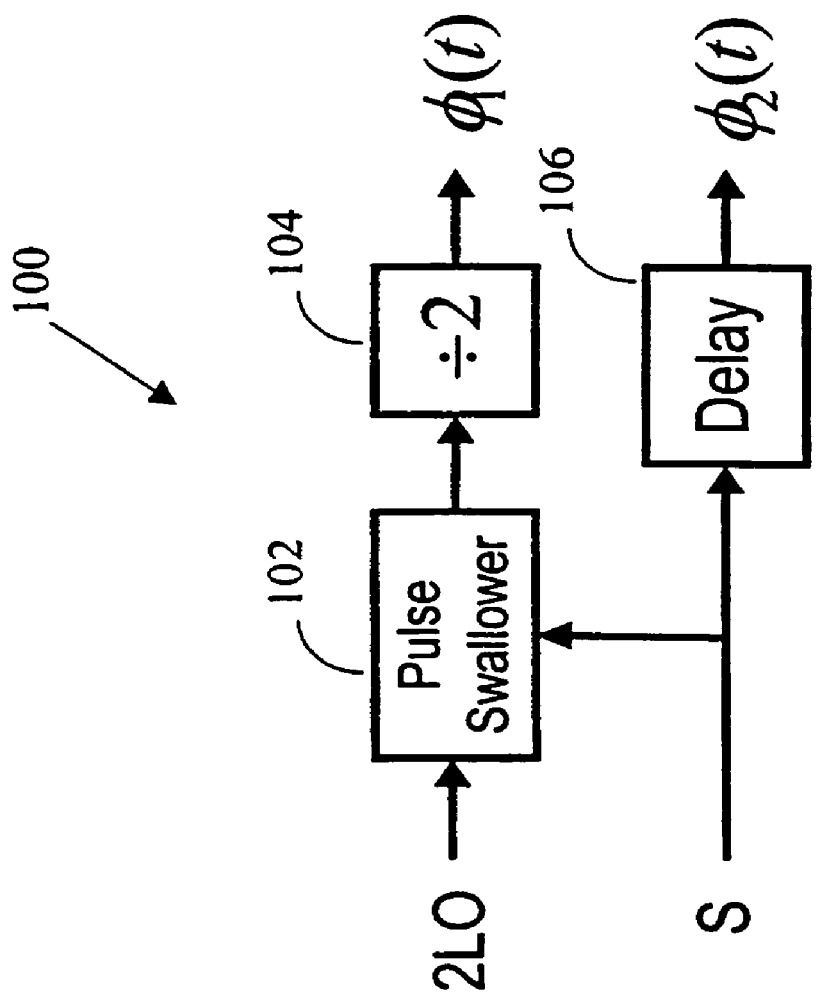
FIG. 6 presents a block diagram of an exemplary signal synthesizer in an embodiment of the invention, employing a pulse swallower and a divide-by-2 circuit.

The synthesizer 100 presented in FIG. 6 uses an input square wave (2LO) at twice the frequency of the RF carrier of the signal being modified by a signal denoted as S. Signal S could be the signal being modified, provided the criteria for the $\phi_1$ and $\phi_2$ signals are met, though generally it will be an independently generated control signal. This control signal S could also be generated using a delta-sigma (Δ-S) modulator which is known in the art.

A pulse swallower 102 is then used to remove pulses from the 2LO square wave. The pulse swallower 102 is controlled by the input signal S, such that when the input signal, S, switches state, a pulse is removed from the 2LO signal. The resulting signal is then passed through a divide-by-2 circuit 104 to produce the $\phi_1(t)$ output signal. The input signal S passes through a delay circuit 106 which delays it by the amount of time it takes the 2LO signal to propagate through to the $\phi_1(t)$ output, so that the two signals are synchronized. The output of this delay circuit 106 is the $\phi_2(t)$ mixer signal.

Assuming that the input signal S follows no regular pattern the output signals $\phi_1(t)$ and $\phi_2(t)$ could be random or pseudo-random. Since this circuit uses an oscillator at twice the carrier frequency of the input signal, there is no LO signal to leak to the output or into other parts of the circuit. Similarly, none of the intermediate signals, nor either of the mixer signals $\phi_1$ and $\phi_2$, has an LO frequency component.

Figure 7:
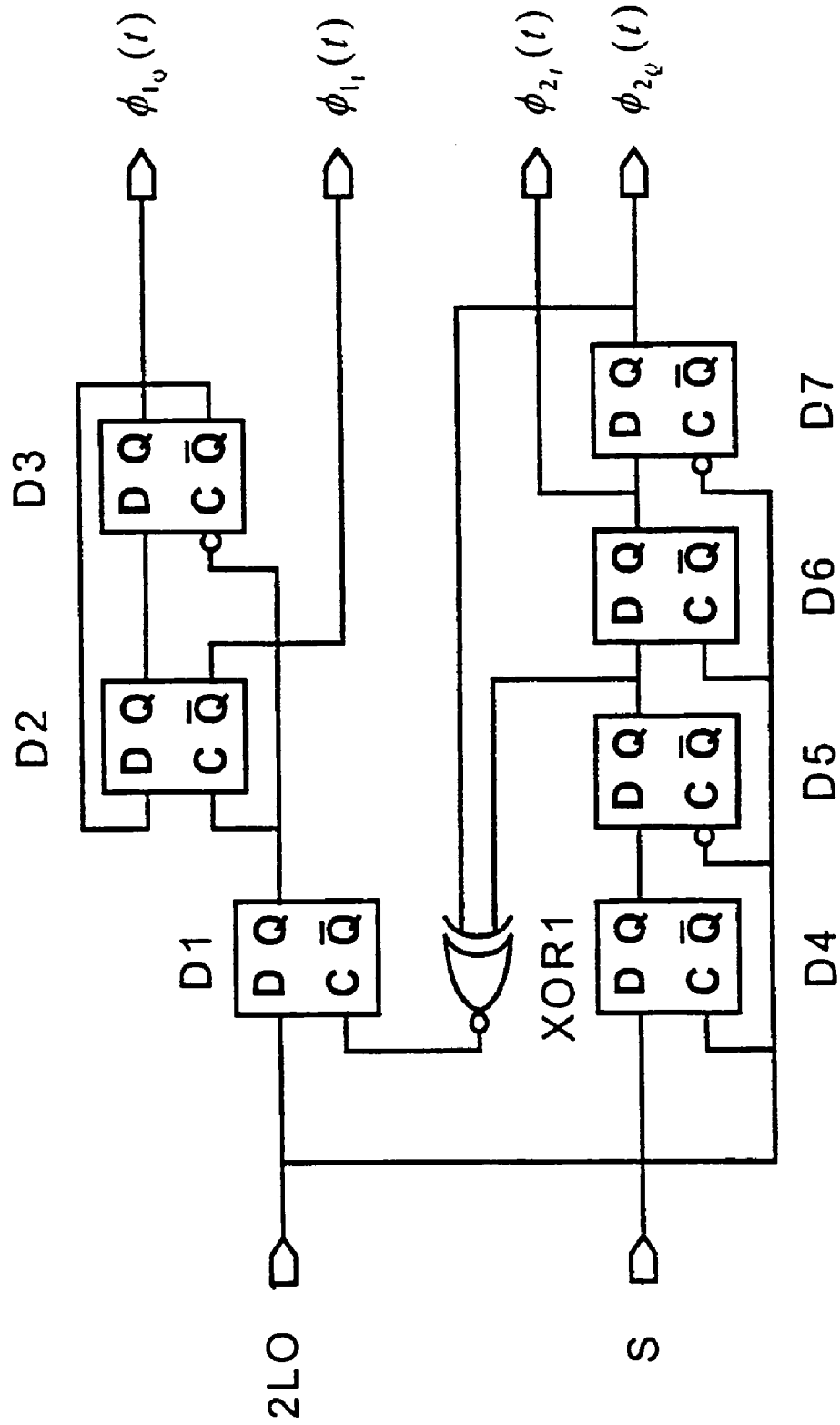
FIG. 7 presents a logic diagram of an exemplary signal synthesizer for generating quadrature mixer signals, in an embodiment of the invention.

A logic circuit that performs the function of FIG. 6 is presented in FIG. 7. The pulse swallower 102 consists of a standard delay latch (D-latch) D1. A D-latch is a flip-flop whose input passes to the output after one clock cycle. The triggering of the pulse swallower 102 is controlled by D-latches D4 through D7 and the exclusive OR (XOR) gate XOR1, which detect the leading edge of the input signal S and create a pulse which causes D1 to swallow a pulse of the input signal 2LO. D-latches D2 and D3 form a divide-by-two circuit 104 that receives the output of D1 and produces the $\phi_1$ mixing signal. The D-latches D4 through D7 also delay the S signal to produce the $\phi_2$ signal. Note that this circuit produces both the I and Q components of $\phi_1$ and $\phi_2$, which would be required for input to a mixer such as that of FIG. 5; subscripts indicate the signals required for the frequency translation of the in-phase and quadrature components of the input signal S, respectively.

Figure 8:
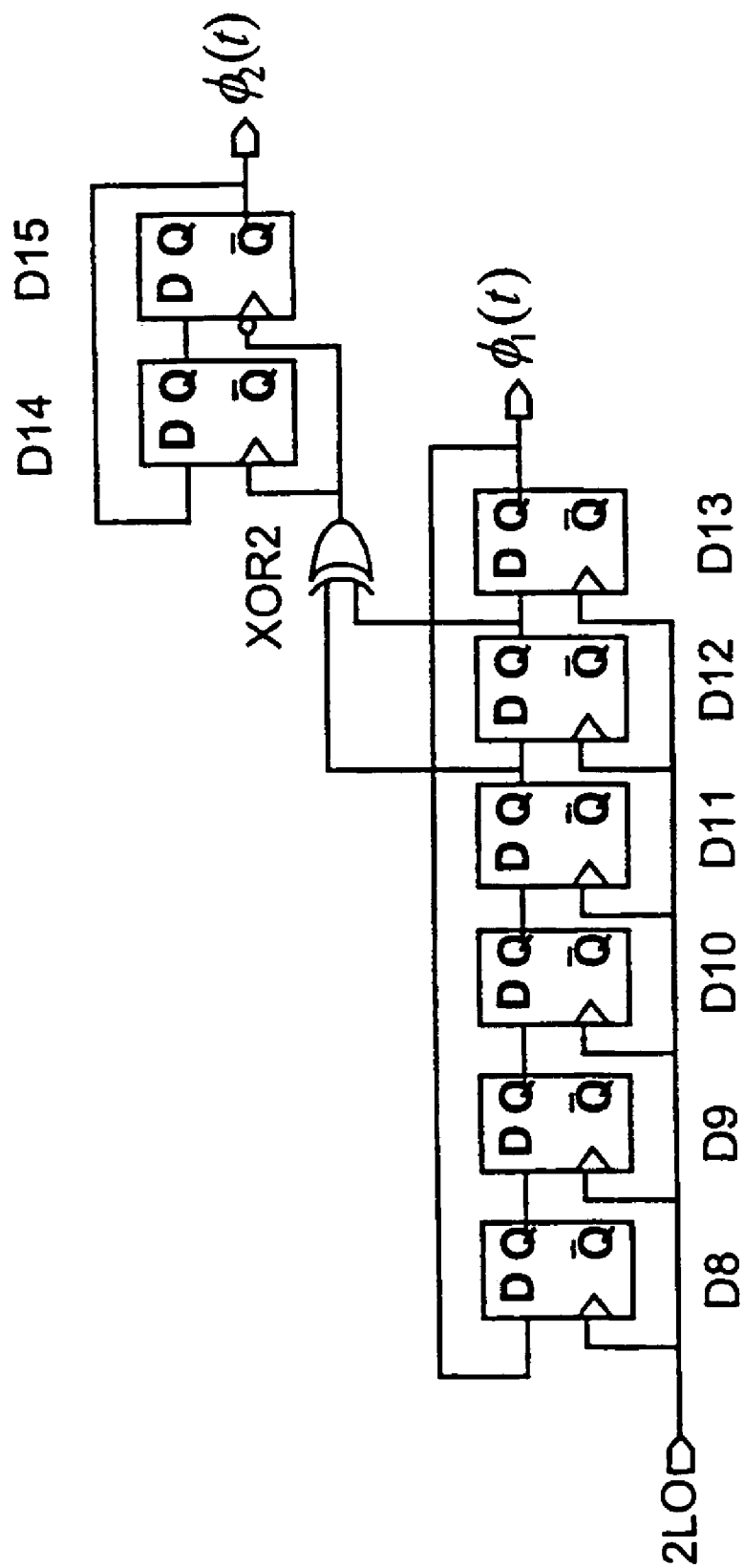
FIG. 8 presents a logic diagram of an exemplary signal synthesizer in an embodiment of the invention, employing a shift register.

FIG. 8 presents another method for producing the signals $\phi_1$ and $\phi_2$. Here, the D-latches D8 through D13 form a shift register which is clocked by the signal 2LO. The signal 2LO is once again a square wave that has a frequency of twice the RF carrier frequency. The shift register can be initially loaded with a predetermined sequence and the output $\phi_1$ will cycle through that sequence producing the desired output. The second output $\phi_2$ is then produced by taking the output of consecutive taps from the shift register, and exclusive-ORing them together with gate XOR2 to produce a signal that can be used to clock a second shift register (D14 and D15). The output of the second shift register is then $\phi_2$.

Figure 9:
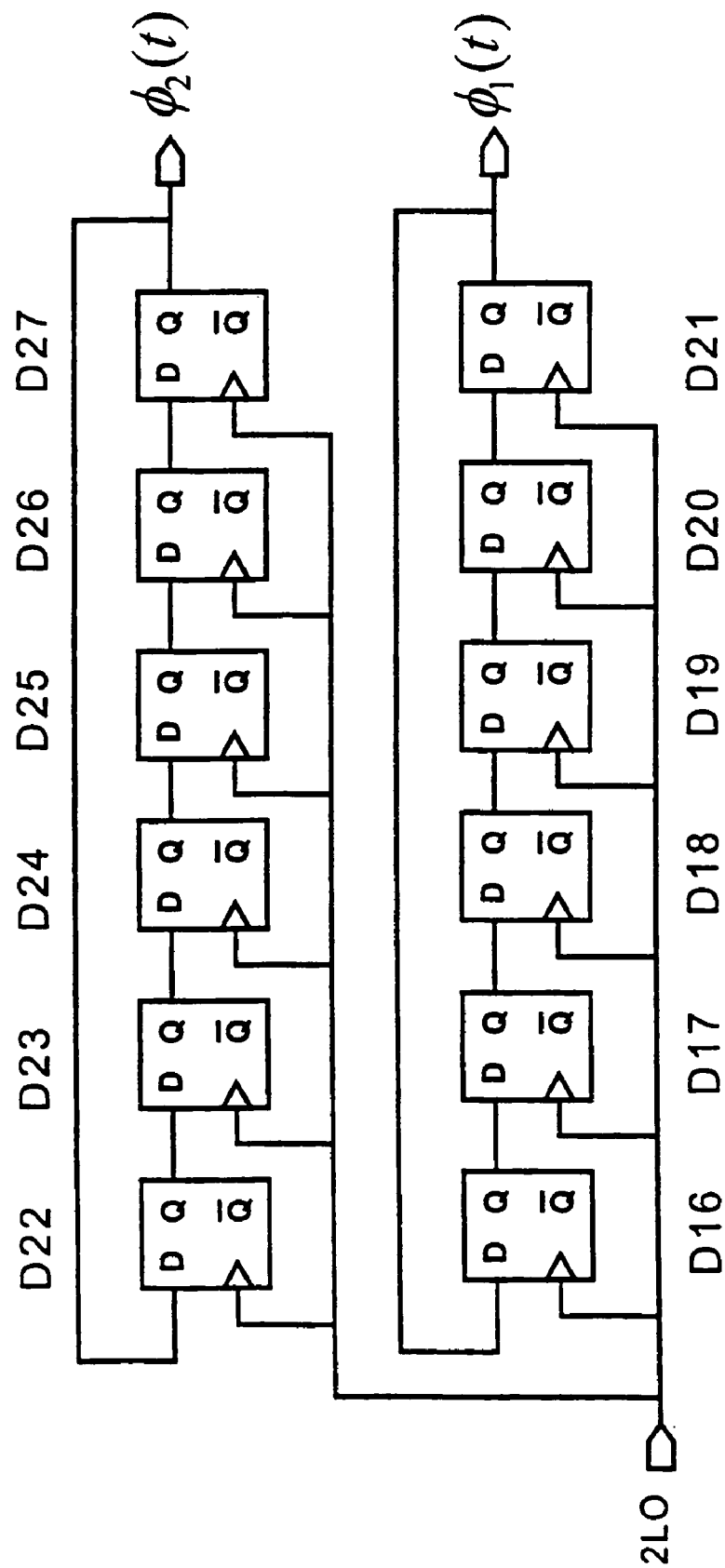
FIG. 9 presents a logic diagram of an exemplary signal synthesizer in an embodiment of the invention, employing two shift registers.
Figure 10:
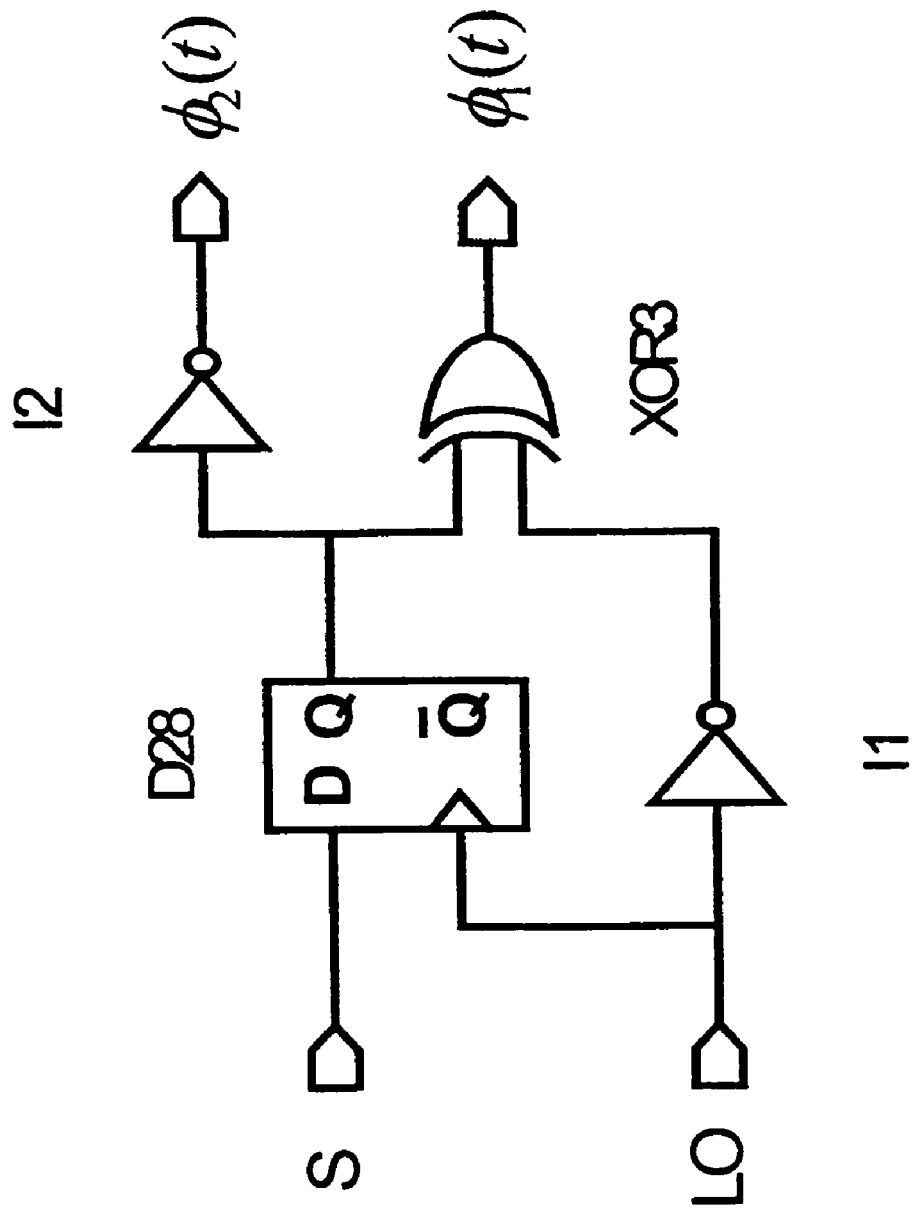
FIG. 10 presents a logic diagram of an exemplary signal synthesizer in an embodiment of the invention, employing an input signal with a frequency equal to the RF carrier.

FIG. 9 shows a method similar to that of FIG. 8, except that signal $\phi_2$ is generated by a second shift register (D22 through D27), which is a duplicate of the shift register that produces the signal $\phi_1$ (D16 through D21). As well, there is a difference in the initial loading of the shift registers; the first shift register being loaded with the sequence that will produce $\phi_1$, and the second being loaded with the sequence which will produce $\phi_2$.

The previous methods of generating $\phi_1$ and $\phi_2$ use an input signal at twice the RF carrier frequency (that is, 2LO). In some situations it may be difficult to design logic to operate at this frequency. If enough isolation can be obtained to protect an input of LO from leaking into the RF band, the method shown in FIG. 10 can be used.

Here the edges of the input signal S are aligned with the LO input edges through the D flip-flop D28. The inverter I1 adds a delay to the LO input to make sure the two signal edges remain aligned. The two signals are then passed through an exclusive OR (XOR) gate XOR3 to produce the output signal $\phi_1$. Another delay is added to the output of the D28 latch via invertor I2 to keep the edges aligned with the output of the XOR gate XOR3. The output of I2 is then $\phi_2$.

Figure 11:
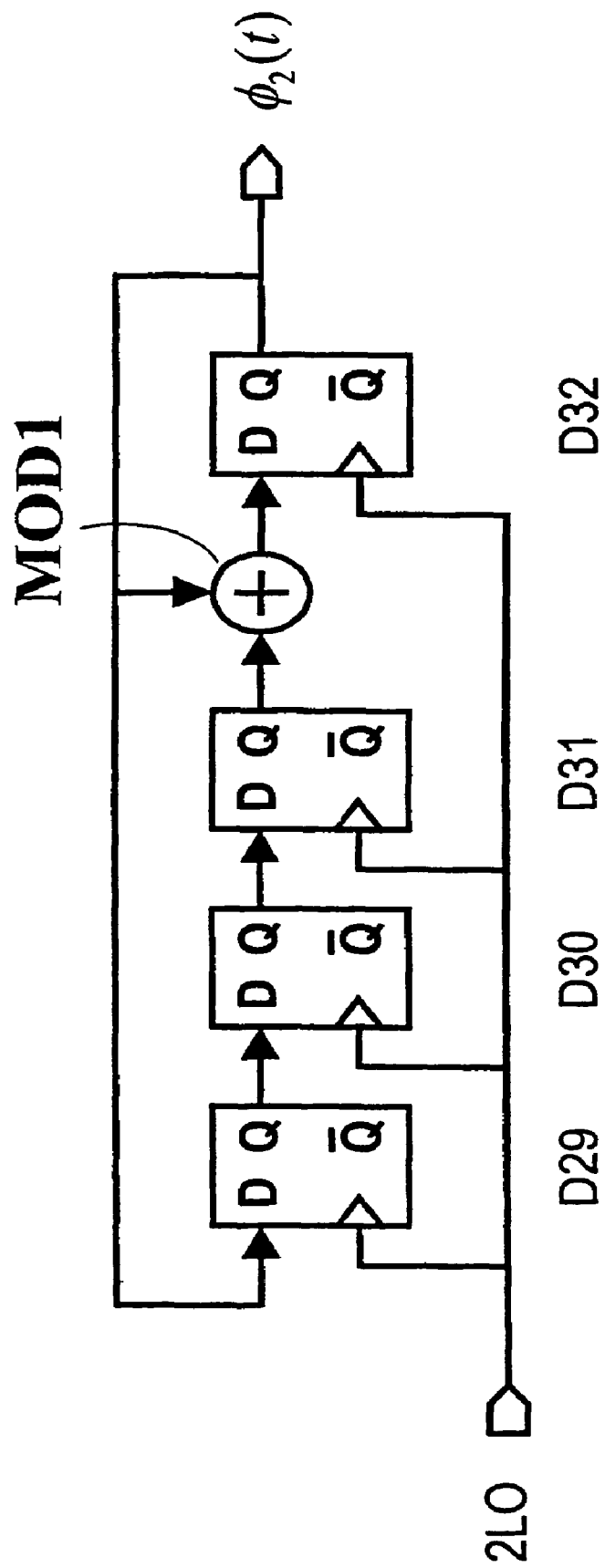
FIG. 11 presents a logic diagram of an exemplary signal synthesizer in an embodiment of the invention, employing a shift register with feedback.

The signal $\phi_2$ can also be generated by using a shift register with feedback similar to those used in the generation of PN sequences for use in spread-spectrum communications. An example of such a shift register is shown in FIG. 11. The D-latches D29 through D32 form a shift register which is clocked by the signal at twice the RF carrier frequency. MOD1 does a modulo-2 multiplication of the output of D31 with the output of D32, which is then fed into the input of D32 to produce the required feedback. The signal $\phi_2$ is then produced at the output of D32. A similar shift register with similar feedback can be used to produce the signal $\phi_1$. The conditions on the design of these shift registers are that they produce the signals $\phi_1$, and $\phi_2$ that have the properties mentioned above:

$\phi_1(t)*\phi_2(t)$ must have a frequency component at the RF carrier frequency;

$\phi_1(t)*\phi_2(t)$ must not contain a significant amount of power at frequencies other that the RF carrier frequency; and $\phi_1(t)$ and $\phi_2(t)$ must not contain a significant amount of energy in the RF signal bandwidth.

The signals of the invention may also be generated in many other ways, which would be clear from the teachings herein. For example, $\phi_1$ could be generated using a control signal S to selectively divide a 2LO signal by either 2 or by 4. In this case, if the value of S is a digital "0" then the 2LO signal could be divided by 2, and if the value of S is a digital "1", the 2LO signal could be divided by 4. The function $\phi_2$ can be derived from the control signal S in a similar manner, to generate a pair of time-varying signals which meet the criteria of the invention to the extent required by the application.

The invention allows one to fully integrate a RF transmitter on a single chip without using external filters, while furthermore, the RF transmitter can be used as a multi-standard transmitter.

The construction of the necessary logic to generate the mixing signals of the invention would be clear to one skilled in the art from the description herein. Such signals may be generated using basic logic gates, field programmable gate arrays (FPGA), read only memories (ROMs), micro-controllers or other devices known in the art. Though the figures herein imply the use of analogue components, all embodiments can be implemented in digital form.

It would be clear to one skilled in the art that many variations may be made to the designs presented herein, without departing from the spirit of the invention. One such variation to the basic structure in FIG. 3 is to add a filter between the two mixers 72 and 74 to remove unwanted signals that are transferred to the output port. This filter may be a low pass, high pass, or band pass filter depending on the transmitter requirements, and may be purely passive, or have active components.

In FIG. 3, two mixer signals are used to perform the down-conversion or up-conversion of x(t). It is also possible to use more than two signals to accomplish the same goal. The block diagram of FIG. 12 presents such a variation, where several functions $\phi_1, \phi_2, \phi_3 \ldots \phi_n$ are used to generate the virtual LO. Here, $\phi_1*\phi_2* \ldots *\phi_n$ has a significant power level at the LO frequency being emulated, but each of the functions $\phi_1 \ldots \phi_n$ contain an insignificant power level at LO. Each of these methods of signal generation can be easily extended to produce more than two signals.

The electrical circuits of the invention may be described by computer software code in a simulation language, or hardware development language used to fabricate integrated circuits. This computer software code may be stored in a variety of formats on various electronic memory media including computer diskettes, CD-ROM, Random Access Memory (RAM) and Read Only Memory (ROM). As well, electronic signals representing such computer software code may also be transmitted via a communication network.

Clearly, such computer software code may also be integrated with the code of other programs, implemented as a core or subroutine by external program calls, or by other techniques known in the art.

The embodiments of the invention may be implemented on various families of integrated circuit technologies using digital signal processors (DSPs), microcontrollers, microprocessors, field programmable gate arrays (FPGAs), or discrete components. Such implementations would be clear to one skilled in the art.

The invention may be applied to various communication protocols and formats including: amplitude modulation (AM), frequency modulation (FM), frequency shift keying (FSK), phase shift keying (PSK), cellular telephone systems including analogue and digital systems such as code division multiple access (CDMA), time division multiple access (TDMA) and frequency division multiple access (FDMA).

The invention may be applied to such applications as wired communication systems include computer communication systems such as local area networks (LANs), point to point signalling, and wide area networks (WANs) such as the Internet, using electrical or optical fibre cable systems. As well, wireless communication systems may include those for public broadcasting such as AM and FM radio, and UHF and VHF television; or those for private communication such as cellular telephones, personal paging devices, wireless local loops, monitoring of homes by utility companies, cordless telephones including the digital cordless European telecommunication (DECT) standard, mobile radio systems, GSM and AMPS cellular telephones, microwave backbone networks, interconnected appliances under the Bluetooth standard, and satellite communications.

While particular embodiments of the present invention have been shown and described, it is clear that changes and modifications may be made to such embodiments without departing from the true scope and spirit of the invention.

What is claimed is:

1. A synthesizer for gene signals to be input to successive mixers for modulating or demodulating an input signal x(t), emulating the mixing of said input signal x(t) with a local oscillator signal having frequency f, said synthesizer comprising:

a first signal generator for producing a first mixing signal $\phi 1$, which varies irregularly over time; and a second signal generator for producing a second mixing signal $\phi 2$ which varies irregularly over time;

where:

$\phi 1*\phi 2$ has significant power at the frequency f of said local oscillator signal being emulated;

neither $\phi 1$ nor $\phi 2$ has significant power at the frequency f of said local oscillator signal being emulated, and said mixing signals $\phi 1$ and $\phi 2$ are designed to emulate said local oscillator signal having frequency f, in a time domain analysis.

2. The synthesizer of claim 1, wherein signals used to generate $\phi 1$ and $\phi 2$ do not have a significant amount of power at the frequency designed to be output from said successive mixers in output signal $x(t)\phi 1\phi 2$.

3. An integrated circuit comprising the synthesizer of claim 1.

4. The synthesizer of claim 2, wherein $\phi 1*\phi 1*\phi 2$ does not have a significant amount of power within the bandwidth designed to be output from said successive mixers, in said output signal $x(t)\phi 1\phi 2$.

5. The synthesizer of claim 4, wherein $\phi 2*\phi 2$ does not have a significant amount of power within the bandwidth designed to be output from said successive mixers in said output signal $x(t)\phi 1\phi 2$.

6. The synthesizer of claim 5, wherein said first and second mixing signals φ1 and φ2 are generated using a single time base.

7. The synthesizer of claim 5, wherein said first and second mixing signals φ1 and φ2 are digital waveforms.

8. The synthesizer of claim 5, wherein said first and second mixing signals φ1 and φ2 are square waveforms.

9. The synthesizer of claim 5, wherein said mixing signal φ2 is a square wave.

10. The synthesizer of claim 5, wherein said mixing signals φ1 and φ2 effect the of an in-phase component of said input signal x(t), and a complementary pair of successive mixers with mixing signals 90 degrees out of phase, are used to effect the modulation of a quadrature component of said input signal x(t).

11. The synthesizer of claim 5, wherein said first and second mixing signals φ1 and φ2 are periodic functions of time.

12. The synthesizer of claim 5, wherein said first and second signal generators comprise:
pulse removal means for removing pulses from a local oscillator signal which has a frequency of twice the RF carrier, generating said first mixing signal φ1; and
complementary means for generating said second mixing signal φ2.

13. The synthesizer of claim 5, wherein said pulse removal means comprises:
a pulse swallower for receiving an oscillator signal at twice the frequency of the local oscillator signal being emulated, and swallowing each pulse with a control signal S; and
a divide by two circuit for receiving and dividing said pulse swallowed signal by two, producing said first mixing signal φ1.

14. The synthesizer of claim 13, wherein said complementary means comprises:
a delay circuit for receiving and delaying said control signal S to be synchronized in time with said first mixing signal φ1, output said delayed control signal S as said second mixing signal φ2.

15. The synthesizer of claim 13, wherein said control signal S comprises a periodic signal.

16. The synthesizer of claim 13, comprising:
a delta-sigma (Δ-S) modulator for generating said control signal S.

17. The synthesizer of claim 5, wherein said first and second signal generators comprise:
shift register means for generating said first and second mixing signals φ1 and φ2 by shifting out corresponding predetermined sequences.

18. The synthesizer of claim 17, wherein said shift register means comprises:
a shift register for receiving an oscillator signal at twice the frequency of the local oscillator signal being emulated, and generating said first mixing signal φ1, by shifting out a predetermined sequence.

19. The synthesizer of claim 18, wherein said second signal generator comprises:
an exclusive-OR (XOR) circuit for comparing outputs of consecutive latches in said shift register, and
a second shift register being clocked by said XOR output, and generating said second mixing signal φ2, by shifting out a second predetermined sequence.

20. The synthesizer of claim 18, wherein said second signal generator comprises:
a third shift register for receiving said oscillator signal at twice the frequency of the local oscillator signal being emulated, and generating said second mixing signal φ2, by shifting out a predetermined sequence.

21. The synthesizer of claim 5, wherein said first and second signal generators comprise:
means for generating said first mixing sigal φ1, from an oscillator signal at the frequency of the local oscillator signal being emulated, and a control signal S having edges aligned with said oscillator signal; and
means for delaying said control signal S to produce said second mixing signal φ2.

22. The synthesizer of claim 21, wherein said means for delaying comprises:
a delay latch for sampling said control signal S at the frequency of the local oscillator signal being emulated; and
an invertor for receiving and inverting said delay latched control signal S to produce said second mixing signal φ2.

23. The synthesizer of claim 22, wherein said means for generating said first mixing signal φ1, comprises:
a second invertor for receiving the oscillator signal at the frequency of the local oscillator signal being emulated; and
an exclusive-OR (XOR) circuit for comparing said inverted oscillator signal with said latched input signal x(t), producing said first mixing signal φ1.

24. The synthesizer of claim 5, wherein said first signal generator comprises:
a shift register with a feedback loop.

25. The synthesizer of claim 24, wherein said first signal generator comprises:
a shift register for receiving an oscillator signal at twice the frequency of the local oscillator signal being emulated, and generating said first mixing signal φ1, by shifting out a predetermined sequence; and
a modulo-2 multiplier for receiving said first mixing signal φ1, and the output of an earlier latch in said shift register, feeding an output into a later latch in said shift register.

26. The synthesizer of claim 5 comprising:
one or more additional signal generators for producing one or more additional mixing signals, varying irregularly over time;
where the product of all of said mixing signals has significant power at the frequency of a local oscillator signal being emulated, and none of said all of said mixing signals has significant power at the frequency of said local oscillator signal being emulated.

27. The synthesizer of claim 5, where said first signal generator comprises:
a divide by 2 circuit ft receiving an oscillator signal at the frequency of the local oscillator signal being emulated; and
a divide by 4 circuit for receiving said oscillator signal at the frequency of the local oscillator signal being emulated;
selector means for routing either the output of said divide by 2 circuit or said divide by 4 circuit to an output, said output producing said first mixing signal φ1.

28. The synthesizer of claim 5 comprising:
first and second latches which are clocked via a common clock, to align said first and second mixing signals φ1 and φ2.

29. The synthesizer of claim 5, wherein the patterns of said first and second mixing signals φ1 and φ2 are different from one another.

* * * * *